United States Patent [19]

Sabnis et al.

[11] 4,206,002
[45] Jun. 3, 1980

[54] GRADED BAND GAP MULTI-JUNCTION SOLAR ENERGY CELL

[75] Inventors: Anant G. Sabnis; Richard A. Butera; Zvi H. Meiksin; all of Pittsburgh; K. S. V. L. Narasimhan, Monroeville, all of Pa.

[73] Assignee: University of Pittsburgh, Pittsburgh, Pa.

[21] Appl. No.: 862,842

[22] Filed: Dec. 21, 1977

Related U.S. Application Data

[63] Continuation-in-part of Ser. No. 733,859, Oct. 19, 1976, abandoned.

[51] Int. Cl.$^2$ .............................................. H01L 31/06
[52] U.S. Cl. ............................ 136/89 MS; 136/89 SJ; 357/30; 357/88; 148/175
[58] Field of Search .......... 136/89 SG, 89 SJ, 89 TF, 136/89 MS, 89 GA; 357/30, 37, 60, 61, 88; 148/175

[56] References Cited

U.S. PATENT DOCUMENTS

| | | | |
|---|---|---|---|
| 3,015,762 | 1/1962 | Shockley | 317/234 |
| 3,046,459 | 7/1962 | Anderson et al. | 317/235 |
| 3,322,575 | 5/1967 | Ruehrwein | 136/89 |
| 3,436,625 | 4/1969 | Newman | 317/237 |
| 3,644,770 | 2/1972 | Bell | 313/94 |
| 3,696,262 | 10/1972 | Antypas | 313/94 |
| 3,769,536 | 10/1973 | Antypas et al. | 313/94 |
| 3,885,178 | 5/1975 | Goehner | 313/1 |
| 3,990,101 | 11/1976 | Ettenberg et al. | 357/30 |
| 4,015,280 | 3/1977 | Matsushita et al. | 357/30 |
| 4,017,332 | 4/1977 | James | 136/89 |

FOREIGN PATENT DOCUMENTS

| | | | |
|---|---|---|---|
| 2502865 | 7/1975 | Fed. Rep. of Germany | 357/30 |
| 1450627 | 9/1976 | United Kingdom | 136/89 |

OTHER PUBLICATIONS

H. J. Hovel, "Semiconductors & Semimetals—vol. 11—Solar Cells," Academic Press, (1975), pp. 103–109.
H. J. Hovel et al., "High Efficiency $Ga_{1-x}Al_xAs$ P-N Junction Solar Cells," IBM Tech. Disc. Bull., vol. 15, p. 3741, (1973).
H. J. Hovel et al., "Photographic Light Meter & Self-Powered Exposure Controller," IBM Tech. Disc. Bull., vol. 15, pp. 3443–3444, (1973).
T. S. Moss, "The Potentialities of Silicon & Gallium Arsenide Solar Batteries," Solid-State Electronics, vol. 2, pp. 222–231, (1961).
P. Rappaport, "The Photovoltaic Effect & Its Utilization," RCA Review, pp. 373–397, (1959).
L. L. Chang et al., "Structures Grown by Molecular Beam Epitaxy," J. Vac. Sci. Technol., vol. 10, pp. 655–662, (1973).
R. Davis et al., "Operation of GaAs Solar Cells at High Solar Flux Intensity," Solar Energy, vol. 17, p. 145, (1975).
M. M. Eisenstadt et al., "Hydrogen Production from Solar Energy," Solar Energy, vol. 17, pp. 59–65, (1975).
B. Ellis et al., "Calculated Efficiencies of Practical GaAs & Si Solar Cells Including the Effect of Built-In Electric Fields," Solid State Electronics, vol. 13, pp. 1–24, (1970).
J. A. Hutchby, "High Efficiency Graded Band-Gap $Al_xGa_{1-x}As$-GaAs P-on-N Solar Cell," Conf. Record, 11th IEEE Photospecialists Conf., May 1975, pp. 414–423.
A. B. Fowler, "Cumulative Photovoltaic Device," IBM Technical Disclosure Bulletin, vol. 4, p. 61, (1962).

Primary Examiner—Aaron Weisstuch
Attorney, Agent, or Firm—Buell, Blenko & Ziesenheim

[57] ABSTRACT

The specification discloses a solar cell having a graded band gap and a plurality of alternately active and inactive p-n junctions. The cell has a gradually changing monocrystalline structure of IIIA–VA compounds. The graded band gaps of the cell are the result of the gradually changing chemical composition of the cell's monocrystalline structure. The junctions are produced by conventional doping techniques.

5 Claims, 4 Drawing Figures

GRADED BAND GAP MULTI-JUNCTION SOLAR ENERGY CELL

This is a continuation-in-part of application Ser. No. 733,859, filed Oct. 19, 1976, now abandoned.

This invention relates to solar cell devices made of monocrystalline compounds, having a graded band gap and having a plurality of alternately active and inactive p-n junctions.

Electrical energy is produced in a semiconductor solar cell when energy from photons of sunlight passing through the cell is absorbed by the semiconducting material thereby raising the electrons in the semiconducting material into a conducting state. For any given chemical composition of semi-conducting material a specific level of energy can be absorbed. The exact amount of energy which is absorbed depends upon the magnitude of the band gap of the semiconductor material. If the photon possesses energy which exceeds the band gap energy of the chemical composition of the cell, that energy will be absorbed and converted into thermal energy and electrical energy. If the photon possesses less energy than the absorption level of the cell, no energy is absorbed. Because the energy level of photons varies with the wavelength of the light, it is impossible for a mono-compound solar cell to absorb all of the energy of the photons of the sunlight which passes through it.

Jackson, in U.S. Pat. No. 2,494,498, issued Aug. 6, 1960, suggested a "stack" of solar conversion cells, each of which is sensitive to a particular range of photon energy to utilize most of the solar spectrum. This stack arrangement has not been feasible in practice due to the difficulty of providing workable contacts to the various respective layers of the stack.

Another proposal, offered as early as 1955, was to build a single solar cell having many chemically different layers with each layer capable of absorbing a different range of photon energy. By suitable doping, a p-n junction could be created within each layer. However, it was soon discovered that a rectifying junction would form at the interface of each layer which blocks current flow and thereby renders the cell highly inefficient, if not useless.

To overcome this problem, Wolf has proposed the use of an ohmic contact between the layers of different semiconductor materials. (Proceeding of the National Electronics Conference, Volume XV, 1959). For optical reasons this ohmic contact has to be in the form of a grid structure. However, Wolf's solution has been impossible to achieve in practice.

Building on Wolf's idea, James, in U.S. Pat. No. 4,017,332, issued Apr. 12, 1977, overcomes the interface problem by treating each layer with a single dopant and creating ohmic contacts at alternate layer interfaces through lattice mismatch.

We provide a single cell having a gradually changing chemical composition and suitably doped to provide a plurality of p portions and n portions within the cell. The gradually changing chemical composition produces a gradually changing band gap within the cell. Different sections of the cell will have different band gaps to enable the cell to absorb many different ranges of photon energy. Accordingly, the cell can convert several photon wavelengths or energy ranges into electrical energy.

We prefer to provide a cell having a band gap range which will permit it to absorb the greatest range of photon energy.

We further prefer to produce the cell using molecular beam epitaxy, or MBE, because this technique permits precise control of the production process, and minimizes any undesirable thermally activated processes such as diffusion.

We further provide a cell having a monocrystalline structure because such a cell is easier to produce than a polycrystalline structure and would be more efficient. Nevertheless, it should be noted that the principles and procedures described herein can be adapted to a polycrystalline cell.

Further objects and advantages of the present invention will be apparent from a consideration of the ensuing description and drawings wherein.

Figure 1:
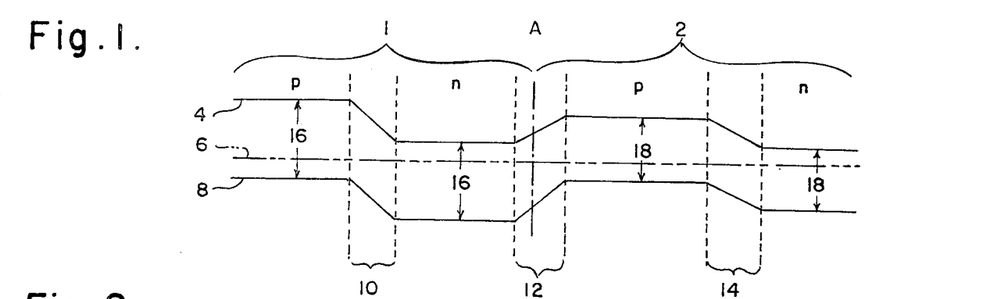
FIG. 1 is an illustration of the energy bands of a simple two layer cell where each layer contains one p-n junction.

Referring to FIG. 1, the abrupt changes in energy levels on the conduction band 4 and valence band 8 occur at the p-n junctions 10–14 within each layer of a two layered cell; also a similar energy change 12 is present where the first layer 1 and second layer 2 meet, Line A. The Fermi energy level 6 appears in the drawing to indicate the relative changes in energy between the p and n portions of the layers which are also identified. It is the heterojunction at the interface of the two layers, Line A, which impedes the flow of light generated current between the layers. Our invention minimizes or eliminates this heterojunction, thereby permitting passage of the light generated current through the cell.

Figure 2:
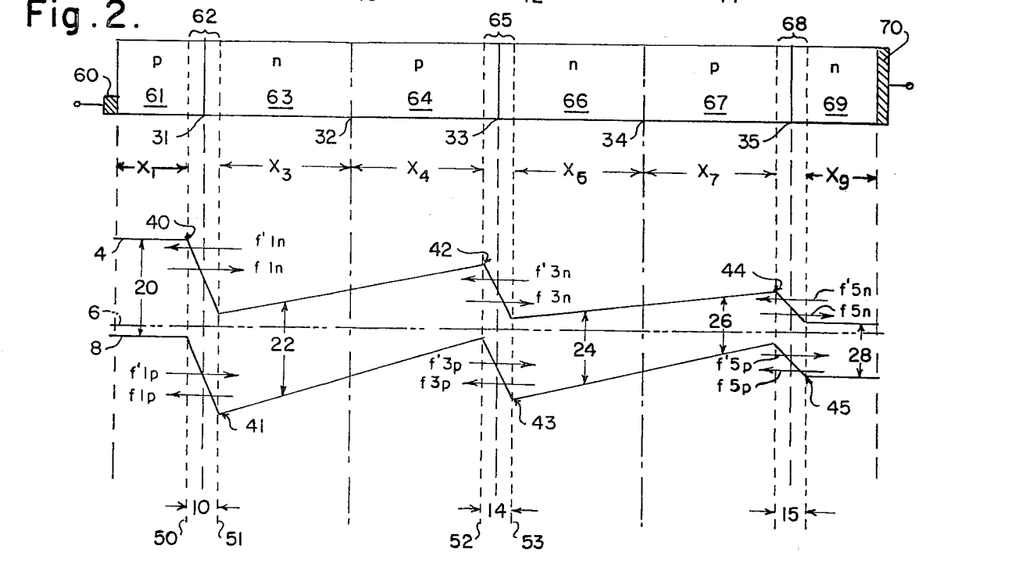
FIG. 2 shows the energy levels and dopant for one embodiment of this invention while open circuited.

Shown in FIG. 2, a presently preferred embodiment of the device is created by gradually growing on a substrate layer 69 of n-type conductivity a III A–V A monocrystalline material having a gradually changing chemical composition. This material can be generally described by the formula $A_{1-x}A'_x B_{1-y}B'_y$ where A and A' are group IIIA elements, B and B' are group VA elements, $0 \leq x \leq 1$ and $0 \leq y \leq 1$. The changing chemical composition produces a gradually changing band gap. This changing band gap is shown (in the lower portion of FIG. 2) by distances 20, 22, 24, 26 and 28, which are progressively smaller. Additionally, dopant levels are controlled to produce a cell having a plurality of alternating p-type regions and n-type regions (as shown in the upper portion of FIG. 2) respectively identified by numbers 61, 64 and 67; and 63, 66 and 69. This doping profile creates five junctions 31, 32, 33, 34 and 35; three of which are active (31, 33 and 35) and two of which are inactive (32 and 34). The active regions of the cell are shown as regions 62, 65 and 68 which correspond to energy level changes 10, 14 and 15. Contacts 60 and 70 are attached to the cell as shown.

The band gap decreases monotonically starting from the top layer where it is the largest, to the substrate layer, where it is the smallest. Electrical series connection of two consecutive active p-n junctions is achieved by an inactive junction. Active junctions are formed by abruptly changing the dopant from p-type conductive to n-conductive, whereas inactive junctions are created between two consecutive active junctions by gradually varying the dopant concentration. The dopant concentration forms the n-type portion near one active junction and gradually changes to form the p-type portion near the next active junction.

The intensity of electric field in the space-charge region which straddles each active junction is considerably higher than the intensity of electric field in the inactive junction region that connects the two consecutive active junctions.

Quasi-neutral regions exist on both sides of each active junction space-charge region. The flow of respective majority carriers in the quasi-neutral regions is dominated by their concentration gradient, and is aided by the internal electric field created by virtue of the separation of minority carriers from the majority carriers due to the changing band gap. The electric field in the quasi-neutral regions is in such direction as to assist the slower moving carriers and oppose the faster moving carriers.

The thickness of the region that connects two consecutive active junctions should be approximately equal to the sum of the diffusion lengths of electrons and holes. The diffusion length of the carriers is equal to the square root of the product of diffusion coefficient and carrier lifetime which will vary according to the material of which the region is composed. But, this value will be constant and can be measured for any given region.

Absorption of light occurs throughout the device. As stated above, the range of light energy which is absorbed is dependent upon the band gap of the material through which it passes. The changing band gap throughout this cell permits a wide range of light energy to be absorbed.

As light energy is absorbed, photovoltages $V_1$, $V_3$ and $V_5$ are respectively developed across active junctions 31, 33 and 35. These photovoltages across junctions 31, 33 and 35 cause electron fluxes $f'_{1n}$, $f'_{3n}$, and $f'_{5n}$ to be injected from regions 63, 66 and 69 respectively into regions 61, 64 and 67 respectively. Similarly, holes are injected from regions 61, 64 and 67 into regions 63, 66 and 69 respectively as indicated by $f'_{1p}$, $f'_{3p}$, and $f'_{5p}$. The currents corresponding to the fluxes constitute the so-called "diode currents $I_D$".

Referring to the band gap diagram portion of FIG. 2, photogenerated electrons at energy levels 40, 42 and 44 will drift from regions 61, 64 and 67 into regions 63, 66 and 69 respectively according to fluxes $f_{1n}$, $f_{3n}$, and $f_{5n}$. Holes located at energy levels 41, 43 and 45 will drift from regions 63, 66 and 69 into regions 61, 64 and 67 respectively according to $f_{1p}$, $f_{3p}$, and $f_{5p}$. The currents corresponding to these fluxes constitute the so-called "light current $I_L$".

The net current through the device is the difference between $I_D$ and $I_L$. For the device to act as a photocell $I_L$ must be greater in magnitude than $I_D$. It can be shown that this condition can be achieved by considering the equations which govern the flow of current within the device.

The carrier profile within the device is governed by the equations:

$$-g(x) = D_n \frac{d^2n}{dx^2} + \mu_n \frac{d(nE)}{dx} - \frac{n - n_p}{\tau_n} \text{ for the } p \text{ region} \quad \text{I.}$$

-continued $$-g(x) = D_p \frac{d^2n}{dx^2} + \mu_p \frac{d(pE)}{dx} - \frac{p - p_n}{\tau_p} \text{ for the } n \text{ region} \quad \text{II.}$$

The current densities in each region are given by:

$$J_n = g\mu_n(nE) + qD_n \frac{dn}{dx} \quad \text{III.}$$

$$J_p = q\mu_p(nE) - qD_p \frac{dp}{dx} \quad \text{IV.}$$

Conduction of current in regions 63 and 64 and regions 66 and 67 can be explained as follows:

These regions are essentially graded band-gap, graded impurity regions. Referring to the diagram shown, the holes find it more easy to flow from left to right than from right to left. Similarly the electrons find it more easy to flow from right to left than from left to right. From equations III and IV it is clear that the net electron and hole currents are the resultant effect of the electric field (E) and the concentration gradient (dn/dx, dp/dx). If the band gap and concentration gradient are so designed that the built-in electric field E has smaller influence than the concentration gradients then we expect a flow of current dominated by diffusion of electrons from left to right and that of holes from right to left. When this happens the device will act as a photocell.

Let us consider planes 50 and 51 in regions 61 and 63 respectively. The electrons which reach plane 50 in region 61 are swept into region 63 due to electric field $E_2$ in region 62. The holes in region 63 which are very close to plane 51 are swept into region 61 due to the electric field $E_2$ in region 62, and some of the holes in region 63 which are away from plane 51 in region 63 will try to rise toward region 64. The ratio of the number of holes rising from region 63 to region 64 ($p_{63-64}$) to the number of holes swept from region 63 to region 61 ($p_{63-61}$) due to electric field $E_2$ can be made small if the electric field $E_2$ in region 62 is much stronger compared to the electric field $E_3$ in region 63. The electric field in region 63 is given by $$E_3 = \frac{1}{q} \frac{dE_v}{dx} \quad \text{V.}$$

Thus if $(dE_v/dx) << E_2$, a majority of the holes would be swept towards the region 61 from region 62.

The electrons going from region 61 to region 63, find it difficult to rise within the region 63. Their motion is governed by equation III, and if the carrier concentration gradient is more dominant than the electric field, electrons will flow from region 63 to region 64 ($n_{63-64}$).

In region 64, electrons near the plane 52 will be swept into region 66 ($n_{64-66}$); and the electrons away from plane 52 and to its left will go down towards the region 63 ($n_{64-63}$). In region 66, the holes near the plane 53 will be swept toward region 64 ($p_{66-64}$); and those away from plane 53 and to its right will try to rise toward region 67 ($p_{66-67}$). With similar argument to above for the holes in region 63, we can say that majority of holes will be swept toward region 64.

The net current in regions 63 and 64 is due to the difference in electron fluxes $n_{63-64}$ and $n_{64-63}$, as well as due to difference in hole fluxes $p_{64-63}$ and $p_{63-64}$. The proposed structure would act as an effective solar cell if:

$$n_{63\text{-}64} < < n_{64\text{-}63} \qquad \text{VI}$$

and $$p_{64\text{-}63} < < p_{63\text{-}64} \qquad \text{VII}$$

In the event the inequalities VI and VII are satisfied, the net current will flow from right to left.

An identical explanation holds for the regions 66, 67 and 69.

If a condition that $$(n_{63\text{-}64} - n_{64\text{-}63}) = (p_{64\text{-}63} - p_{63\text{-}64}) \qquad \text{VIII}$$

is met in the regions 63 and 64, and that $$(n_{66\text{-}67} - n_{67\text{-}66}) = (p_{67\text{-}66} - p_{66\text{-}67}) \qquad \text{IX}$$

is met in the regions 66 and 67 then there will exist a continuity of current in the device. The electrons and holes will recombine in regions 63, 64 and regions 66 and 67, and produce the effect of an ohmic contact.

For successful operation of the device at least the following conditions must be met:

A. The electric fields must be such that:

| | |
|---|---|
| $\|E_2\| >> \|E_3\|$ | in region 63 |
| $\|E_5\| >> \|E_4\|$ | in region 64 |
| $\|E_5\| >> \|E_6\|$ | in region 66 |
| $\|E_8\| >> \|E_7\|$ | in region 67 |

B. The flow of carriers in regions 63, 64, 66 and 67 should be dominated by the concentration gradient there.

C. $(J_n + J_p)$ is the same in all the regions.

To illustrate that the above conditions can be met we show some sample calculations for GaAs:

The maximum value of the electric fields in the space charge regions of junctions 62, 65 and 68 (assuming abrupt junctions) is given by:

$$|E_{max}| = \sqrt{\frac{2q\,\phi_o}{\epsilon} \cdot \frac{N_A N_D}{N_A + N_D}} \qquad \text{XI}$$

where $$\phi_o = \frac{kT}{q} \ln \frac{N_a N_d}{n_i^2} \qquad \text{XII}$$

and the space charge width is given by $$X = \sqrt{\frac{2\epsilon \phi_o (N_A + N_D)}{q\, N_D N_A}} \qquad \text{XIII}$$

We calculate typical values of $E_{max}$ and $X$ for the case of a GaAs junction using: $N_A = 10^{18} \text{cm}^{-3}$ and $N_D = 10^{16} \text{cm}^{-3}$, $n_i = 10^7$ $$E = E\ E = 12 \times 8.854 \times 10^{-14} \text{F/CM}$$
$$kT/q = 25 \times 10^{-3} \text{ volt at room temperature}$$

which gives:

$\phi_o \approx 1.15$ volts from equation XII
$E_{max} = 0.587 \times 10^5$ volts/cm from equation XI
$X = 0.3917$ μm from equation XIII From A. G. Milnes' and D. L. Feucht's text, *Heterojunctions and Metal-Semiconductor Junctions* (Academic Press, 1972) at page 130 the diffusion lengths for GaAs are: $L_n = 3.5$ μm and $L_p = 2$ μm. This means that $X_3 = 3.5$ μm and $X_4 = 2$ μm and that $X_3 + X_4 = 5.5$ μm. Consequently:

$$E_3 = E_4 = \frac{1}{q} \frac{dE_c}{dx} = 0.5 \times 10^3 \text{ volts/CM}$$

$E_c$ in regions 63 and 64 can be calculated from the band gap difference between junctions 31 and 33. In the present preferred embodiment that difference is approximately 0.3 electron volts.

Consequently, $E_{max}$ is greater than $E_3$ or $E_4$ by about two to three orders of magnitude. By keeping the widths $X_3$, $X_4$, $X_6$ and $X_7$ of regions 63, 64, 66 and 67 equal to the diffusion lengths of the materials in those regions, the condition A, supra, can be met.

Conditions B and C can be met by suitable tailoring of the band gaps and the doping levels in each region of the device. These parameters can also be controlled to enable optimization of the cell as desired.

As an illustration of this concept consider a cell having three active junctions like that shown in FIG. 2. It can be designed so that

| | |
|---|---|
| $X_1 = 5$ μm | for $N_A > 10^{18} \text{cm}^{-3}$ |
| $X_3 = 3$ μm | for $10^{16} > (N_D - N_A) > -10^{16} \text{cm}^{-3}$ from |
| $X_4 = 3$ μm | plane 51 to plane 52 |
| $X_6 = 3.5$ μm | for $10^{16} > (N_D - N_A) > -10^{16} \text{cm}^{-3}$ |
| $X_7 = 3.5$ μm | |
| $X_9 = 200$ μm | for $N_D = 10^{17} \text{cm}^{-3}$ | where $N_A$ is the acceptor doping level, $N_D$ is the donor doping level, and n-type dopants are Sn, Te or S, and the p-type dopants are Zn or Mg.

Figure 3:
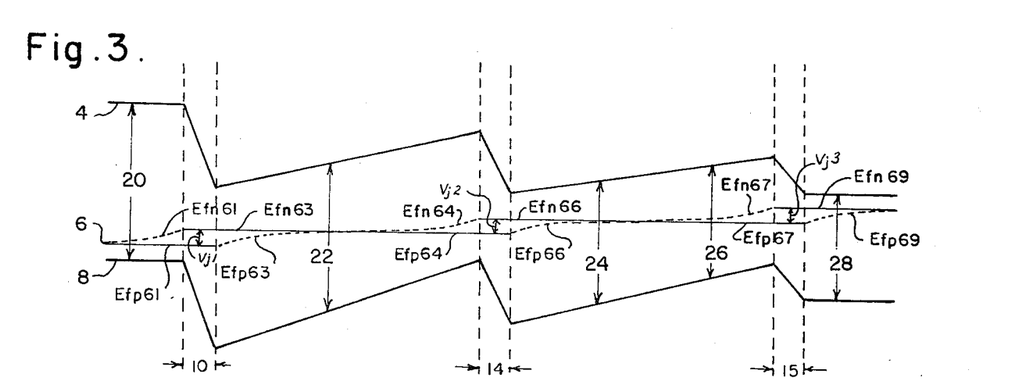
FIG. 3 shows the energy levels for the embodiment shown in FIG. 2 when a load has been attached.

When the cell is connected to a load, photovoltage would occur at each active junction. The sum of each of these voltages would equal the total voltage output of the cell. Referring to the Fermi levels shown in FIG. 3 for each section of the cell, the total voltage across the device is simply the difference between $(1/q)\,E_{fn69}$ and $(1/q)\,E_{fp61}$. That difference is the sum $V_{j1} + V_{j2} + V_{j3}$. It should be noted that in order to show the changes in the Fermi level, energy bands 4 and 8 are wider apart in FIG. 3 than in FIG. 2; however, the band gaps are the same as shown by distances 20, 22, 24, 26 and 28.

The light generated current will not encounter any meaningful resistance as it passes through the cell because whenever there is a transition of conductivity from n-type to p-type, it seems that there would exist a plane where the material becomes intrinsic. Generally, the point where the extrinsic Fermi level is midway between the conduction band minima and the valence band maxima the material is considered intrinsic. This is true only if the effective masses of conduction electrons and the holes are equal. In the III A–V A materials the two effective masses are not always equal. In any case, even if there exists a thin intrinsic plane within the structure, it will not offer much resistance to the conduction current because the resistance is directly proportional to the length and inversely proportional to the cross-sectional area. The device under consideration has a relatively large cross-sectional area, and very small length. Consequently, any resistance produced would be caused by intrinsic planes of negligible thickness. Such planes will produce a negligible resistance to the conduction of current through the cell.

Figure 4:
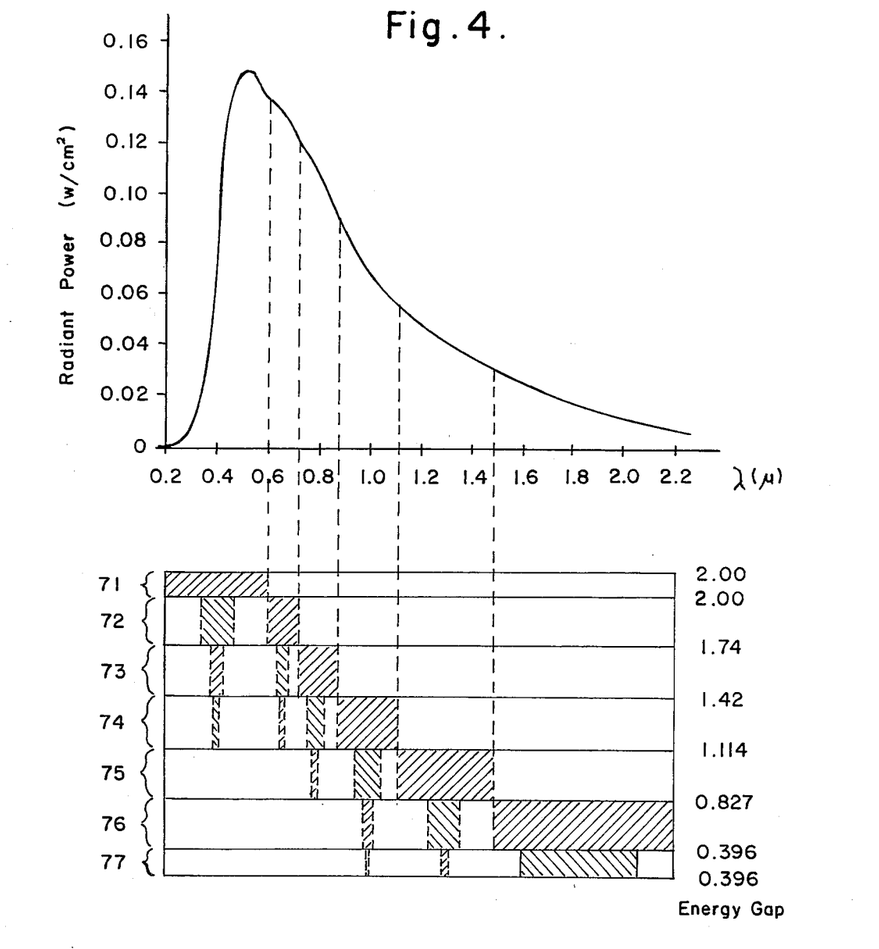
FIG. 4 indicates the manner in which a present preferred embodiment of the cell would absorb photon energy.

FIG. 4 indicates how one embodiment of our cell would operate. At the top of the figure is a graph of the radiant power of photons for various wavelengths of light in the solar spectrum. The chart below the graph illustrates the photon energy which is being absorbed at seven cross-sections of the cell and the energy gaps at the outer planes of those sections. As the complete solar spectrum of light passes through the cell, energy is absorbed throughout the cell. The range of photon energy absorbed by each section of the cell is shown by the shaded areas. If a portion of the energy of a photon is not absorbed in the first section 71 shown as having a constant energy gap of 2.00 eV, that portion of energy passes through the cell until it reaches a section of the cell with a different band gap such as section 72, having a band gap range from 2.00 eV to 1.74 eV, where it may be partially or completely absorbed. Energy not yet absorbed continues until it reaches another area, 73 with a still different band gap and there it may be partially or completely absorbed. Similarly, unabsorbed photons pass through the cell and are absorbed in other sections 74, 75, 76 and 77 of the cell. To achieve optimum results the cell should be designed to utilize all of the energy of the photons of the solar spectrum.

One embodiment of the multi-layered solar cell which utilizes 90.3% of the photon energy of the solar spectrum is a cell having a thickness of 33 $\mu$m. The chemical composition is controlled so that the composition of the cell changes from $GaP_{0.85}Sb_{0.15}$ at section 71 to $GaP_{0.67}Sb_{0.32}$, then to $GaP_{0.47}Sb_{0.53}$, then to $GaP_{0.28}Sb_{0.72}$, then to $GaP_{0.08}Sb_{0.92}$; and then to $Ga_{0.75}In_{0.25}Sb$ at some plane within regions 72, 73, 74, 75 and 76 respectively.

A second embodiment of the cell also has a gradually changing composition but consisting of $Al_{0.8}Ga_{0.2}As$, $Al_{0.44}Ga_{0.56}As$, GaAs, $Ga\ As_{0.6}Sb_{0.4}$, $Ga\ As_{0.24}Sb_{0.76}$; and $Ga_{0.54}In_{0.46}Sb$ respectively.

The solar cells made in accordance with our invention will have energy conversion efficiencies above 50%. This is a significant improvement over current silicon cells which have an energy conversion efficiency of about 14%, which is predicted to rise to only 20% as our technology advances. Furthermore, it would require 5.24 m$^2$ of active surface of our cell to produce 1kw, while current silcon cells producing 52 w/m$^2$ would require 19.23 m$^2$ of active surface. If the cost of producing the cells described herein were the same as the current silicon converters, the cost per kilowatt would be 13.6% of that for Si converters. However, the production costs of such cells should be significantly less. Through the use of the MBE technique, which allow for multiple cell production, the cost per cell should be decreased approximately one hundred fold. Fabrication of these cells can be computerized since a computer can be programmed to monitor crystal growth, control substrate temperatures and adjust shutters on the molecular beams to maintain the desired constituent and dopant concentration as a function of distance within the crystal. Production costs should also be reduced because the manufacturing system to produce these cells which will be bonded to large panels will be dedicated to a single product. These savings should result in production of a solar cell having a capital cost per kilowatt which is comparable with nuclear or fossil fuel generating stations.

The invention may be broadly defined as a solar cell comprising:

a. a substrate layer of a crystalline material selected from the group consisting of III-A-V-A compounds; and b. A monocrystalline layer on said substrate
  (i) composed of III-A-V-A compounds such that the composition of the monocrystalline layer is continuously changing and of the general form $A_{1-x}A'_xB_{1-y}B'_y$ where A and A' are group IIIA elements selected from the group consisting of Al, Ga and In, B and B' are group VA elements selected from the consisting of P, As and Sb, $0 \leq x \leq 1$ and $0 \leq y \leq 1$ whereby continuously changing band gaps are provided;
  (ii) suitably doped to produce a plurality of alternately active and inactive junctions; and
  (iii) having a p-region on one side and an n-region on the other side of each inactive junction, and an active region about each active junction said active region being bounded by an n-region and a p-region such that
    (a) in each p-region and in each n-region the flow of carriers is dominated by the region's concentration gradient;
    (b) in each and every p-region and in n-region the current density is the same;
    (c) the electric field in each active region is much stronger than the electric fields in the p-region and n-region adjacent to it; and
    (d) the length of each region substantially equals the diffusion length of electrons generated in each region.

While we have shown and described a present preferred embodiment of the invention and a present preferred method of practicing the same it is distinctly understood that the invention is not limited thereto but may be otherwise variously embodied and practiced within the scope of the following claims.

We claim:

1. A solar cell comprising:
  a. a substrate layer of a crystalline material (compound) selected from the group consisting of compounds of group III-A-V-A elements (element compounds); and
  b. a monocrystalline layer on said substrate
    (i) composed of material selected from the group consisting of III-A-V-A compounds (element compounds) such that the composition of the monocrystalline layer is continuously changing and of the general form $A_{1-x}A'_xB_{1-y}B'_y$ where A and A' are group IIIA elements selected from the group consisting of Al, Ga and In, B and B' are group VA elements selected from the group consisting of P, As and Sb, $0 \leq x \leq 1$ and $0 \leq y \leq 1$ whereby progressively narrower (continuously changing) band gaps are provided;
    (ii) suitably doped to produce a plurality of alternately active and inactive junctions; and
    (iii) having a p-region on one side and n-region on the other side of each inactive junction, and an active region about each active junction, said active region being bounded by an n-region and a p-region such that
      (a) in each p-region and in each n-region the flow of carriers is dominated by the region's concentration gradient;
      (b) (in each and every p-region and in n-region) the net current (density) throughout the cell is the same;
      (c) the electric field in each active region is much stronger than the electric fields in the p-region and n-region adjacent to it; and (d) the width (length) of each (each) region between active junctions substantially equals the diffusion length of the electrons and holes generated in (each) each said region.

2. The solar cell claimed in claim 1 having been produced with molecular beam epitaxy.

3. The solar cell claimed in claim 1 wherein said monocrystalline layer comprises in sequence doped cross-sectional areas of $GaP_{0.85}Sb_{0.15}$, $GaP_{0.67}Sb_{0.32}$, $GaP_{0.47}Sb_{0.53}$, $GaP_{0.28}Sb_{0.72}$, $GaP_{0.09}Sb_{0.91}$, and $Ga_{0.75}In_{0.25}Sb$.

4. The solar cell claimed in claim 1 wherein said monocrystalline layer comprises in sequence doped cross-sectional areas of $Al_{0.8}Ga_{0.2}As$, $Al_{0.44}Ga_{0.56}As$, $GaAs$, $GaAs_{0.6}Sb_{0.4}$, $GaAs_{0.24}Sb_{0.76}$, and $Ga_{0.54}In_{0.46}Sb$.

5. The solar cell claimed in claim 1 also comprising contacts attached to the substrate and the monocrystalline compound.

* * * * *

UNITED STATES PATENT AND TRADEMARK OFFICE
CERTIFICATE OF CORRECTION

PATENT NO. : 4,206,002
DATED : June 3, 1980
INVENTOR(S) : ANANT G. SABNIS, RICHARD A. BUTERA, ZVI H. MEIKSIN and K.S.V.L. NARASIMHAN It is certified that error appears in the above-identified patent and that said Letters Patent are hereby corrected as shown below:

Column 2, line 30, "10-14" should be --10 and 14--.

Column 5, about line 59, the equation should read:

-- $E = E_r E_0 = 12 \times 8.854 \times 10^{-14}$ F/CM --.

Signed and Sealed this

Twenty-first Day of October 1980

[SEAL]

Attest:

SIDNEY A. DIAMOND

Attesting Officer — Commissioner of Patents and Trademarks

UNITED STATES PATENT AND TRADEMARK OFFICE
CERTIFICATE OF CORRECTION

PATENT NO. : 4,206,002          Page 1 of 2

DATED : June 3, 1980

INVENTOR(S) : ANANT G. SABNIS, RICHARD A. BUTERA, ZVI H. MEIKSIN and K.S.V.L. NARASIMHAN It is certified that error appears in the above—identified patent and that said Letters Patent are hereby corrected as shown below:

Claim 1, column 8, lines 37-38 "(compound)" should be deleted.

Claim 1, column 8, lines 39-40 "(element compounds)" should be deleted.

Claim 1, column 8, lines 43-44 "(element compounds)" should be deleted.

Claim 1, column 8, lines 51-52, "(continuously changing)" should be deleted.

UNITED STATES PATENT AND TRADEMARK OFFICE
CERTIFICATE OF CORRECTION

PATENT NO. : 4,206,002

DATED : June 3, 1980

INVENTOR(S) : ANANT G. SABNIX, RICHARD A. BUTERA, ZVI H. MEIKSIN and K.S.V.L. NARASIMHAN It is certified that error appears in the above–identified patent and that said Letters Patent are hereby corrected as shown below:

Claim 1, column 8, lines 63, "(in each and every p-region and in n-region)" should be deleted.

Claim 1, column 8, line 64, "(density)" should be deleted.

Claim 1, column 9, "(length)" and "(each)" should be deleted.

Claim 1, column 9, line 4, "(each)" should be deleted.

Signed and Sealed this

Eighteenth Day of November 1980

[SEAL]

Attest:

SIDNEY A. DIAMOND

Attesting Officer

Commissioner of Patents and Trademarks